United States Patent
Kitayama et al.

(10) Patent No.: US 8,448,196 B2
(45) Date of Patent: May 21, 2013

(54) FLEXIBLE PRINTED CIRCUIT AND ELECTRIC APPARATUS AND OPTICAL DISC DRIVE HAVING FLEXIBLE PRINTED CIRCUIT

(75) Inventors: Akira Kitayama, Tachikawa (JP); Kouichi Ihara, Yokohama (JP); Kenji Takahashi, Kawaguchi (JP); Tatemi Ido, Hachioji (JP)

(73) Assignees: Hitachi Consumer Electronics Co., Ltd., Tokyo (JP); Hitachi—LG Data Storage, Inc., Tokyo (JP)

( * ) Notice: Subject to any disclaimer, the term of this patent is extended or adjusted under 35 U.S.C. 154(b) by 128 days.

(21) Appl. No.: 12/947,319

(22) Filed: Nov. 16, 2010

(65) Prior Publication Data

US 2011/0126221 A1 May 26, 2011

(30) Foreign Application Priority Data

Nov. 24, 2009 (JP) ................... 2009-265867

(51) Int. Cl.
*G11B 33/12* (2006.01)
(52) U.S. Cl.
USPC .......................................... 720/652
(58) Field of Classification Search
USPC ............... 360/245.8, 245.9, 264.2; 720/652, 720/653
See application file for complete search history.

(56) References Cited

U.S. PATENT DOCUMENTS

| | | | |
|---|---|---|---|
| 6,172,488 B1 * | 1/2001 | Mizutani et al. | 323/207 |
| 6,320,835 B1 * | 11/2001 | Kamei | 720/653 |
| 6,493,190 B1 * | 12/2002 | Coon | 360/245.9 |
| 6,797,891 B1 * | 9/2004 | Blair et al. | 174/268 |
| 6,894,874 B2 * | 5/2005 | Maruyama et al. | 360/245.9 |
| 6,963,471 B2 * | 11/2005 | Arai et al. | 360/246 |
| 7,016,156 B2 * | 3/2006 | Maruyama et al. | 360/245.8 |
| 7,406,701 B2 * | 7/2008 | Kim | 720/652 |
| 7,504,587 B2 * | 3/2009 | Masu et al. | 174/117 R |
| 7,564,695 B2 * | 7/2009 | Matsumoto | 361/794 |
| 7,875,826 B2 * | 1/2011 | Miller et al. | 219/121.61 |
| 7,986,495 B2 * | 7/2011 | Kamei et al. | 360/246 |
| 8,117,627 B2 * | 2/2012 | Gotoh et al. | 720/601 |
| 8,248,732 B2 * | 8/2012 | Nishiyama et al. | 360/245.9 |
| 8,274,760 B1 * | 9/2012 | Zhang et al. | 360/245.9 |
| 2005/0007897 A1 | 1/2005 | Soda et al. | |
| 2005/0116792 A1 * | 6/2005 | Moon et al. | 333/161 |
| 2006/0041897 A1 * | 2/2006 | Takahashi et al. | 720/652 |
| 2007/0222052 A1 * | 9/2007 | Kabumoto | 257/679 |

(Continued)

FOREIGN PATENT DOCUMENTS

| | | |
|---|---|---|
| JP | 2001-35144 A | 2/2001 |
| JP | 2002-230959 A | 8/2002 |
| JP | 2005-44492 A | 2/2005 |

*Primary Examiner* — Brian Miller
(74) *Attorney, Agent, or Firm* — Crowell & Moring LLP

(57) ABSTRACT

An electronic device including a mechanism for changing the relative positions of two circuit boards such as in an optical disc drive is provided. A flexible printed circuit electrically connected between the two circuit boards changes shape to suppress fluctuations in the transmission characteristics occurring due to contact with metal such as a case, and provides stable signal transmission. The flexible printed circuit includes at least one or more differential lines, a fixed unit affixed to a case at least at one location, and a movable unit that changes shape according to the relative positions of two cases. The lines adjacent to the differential line are a grounded surface, and the flexible printed circuit is formed to narrow the distance between the movable unit lines more than the distance between the fixed unit lines.

20 Claims, 14 Drawing Sheets

U.S. PATENT DOCUMENTS

| | | | |
|---|---|---|---|
| 2010/0157482 A1* | 6/2010 | Hirata | 360/245.8 |
| 2010/0276183 A1* | 11/2010 | Ookawa et al. | 174/254 |
| 2011/0109407 A1* | 5/2011 | Horie | 333/238 |
| 2011/0126221 A1* | 5/2011 | Kitayama et al. | 720/600 |
| 2011/0203834 A1* | 8/2011 | Yoneya et al. | 174/250 |
| 2011/0292549 A1* | 12/2011 | Arai | 360/245.8 |
| 2012/0112563 A1* | 5/2012 | Shido et al. | 307/147 |

* cited by examiner

FLEXIBLE PRINTED CIRCUIT AND ELECTRIC APPARATUS AND OPTICAL DISC DRIVE HAVING FLEXIBLE PRINTED CIRCUIT

CLAIM OF PRIORITY

The present application claims priority from Japanese patent application JP 2009-265867 filed on Nov. 24, 2009, the content of which is hereby incorporated by reference into this application.

FIELD OF THE INVENTION

This invention relates to a line structure for a flexible printed circuit (FPC) and an electronic device and optical disc drive utilizing that FPC.

BACKGROUND OF THE INVENTION

The technology of the FPC of the related art includes a section clamped to a case by adhesive tape, and a section whose shape changes according to the disc tray pullout position (e.g. as shown in JP-A 2002-230959).

The technology for an optical disc drive of the related art consists of a first structure for sending an interface signal consisting of a PATA (Parallel Advanced Technology Attachment) from an external interface connector mounted on a first circuit board, to a DSP (Digital Signal Processor) mounted on a second circuit board; and a second structure for sending a PATA signal from an external interface connector mounted on the first circuit board, to the DSP mounted on the first circuit board (See for example JP-A 2001-035144 and JP-A 2005-044492.)

SUMMARY OF THE INVENTION

Flexible printed circuits (FPC) possessing durability and flexibility are commonly utilized as wiring between circuit boards in electronic devices including a mechanism in which the relative positions of two circuit boards change.

In a disc tray pullout type optical disc drive mounted for example in a notebook PC, a FPC is utilized between the first circuit board affixed to the case, and a second circuit board affixed to the disc tray. The FPC consists of a section (hereafter called a fixed unit) clamped to the case by adhesive tape or a similar item, and a section whose shape changes according to the disc tray pullout position (hereafter called a movable unit) as disclosed in JP-A 2002-230959 in literature relating to FPC.

The above type of optical disc drive currently available as commercial products, mainly consists of the structure in FIG. 4 or namely a first structure for sending an interface signal consisting of a PATA (Parallel Advanced Technology Attachment) from an external interface connector 19 mounted on a first circuit board 17, to a DSP (Digital Signal Processor) 15 mounted on a second circuit board 18; and the structure in FIG. 5 or namely a second structure for sending a PATA signal from an external interface connector 19 mounted on the first circuit board 17, to the DSP 15 mounted on the first circuit board. Optical disc drive with this type of structure are disclosed for example in JP-A-2001-035144 and JP-A-2005-044492, etc.

The transmission speed of the signal sent on the FPC1 of the above first structure is a signal speed of 33 Mbps in the PATA of the first structure, and a maximum of approximately 400 Mbps along the line transmitting the recording signal in the second structure. In this second structure in particular, impedance mismatches and transmission losses along the line from the DSP to the optical pickup, as well as the deterioration in transmission characteristics due to capacitive coupling caused by the movable unit 3 of the FPC1 making contact with nearby metal such as metal plate on the back-side of the disc tray when the disc tray 14 is housed may cause direct effects on writing and reading quality. Taking these problems into account is essential when designing the FPC1 line.

Demand for transmitting high speed signals on FPC is definitely increasing. Technology for high speed external interfaces is also progressing even in electronic devices such as optical disc drive. Considerable progress has already been made in a changeover from PATA to SATA (Serial Advanced Technology Attachment). The second structure for optical disc drive has a short distance within several centimeters from the external interface connector to the DSP, and the line design is simple because there is minimal reflection loss and transmission loss on the line so devices supporting SATA are already available in commercial product.

However, when a SATA signal must be sent in the first structure (Hereafter, referred to as the third structure, shown in FIG. 6A and FIG. 6B.) such as by sending a 1.5-3.0 Gbps differential signal along a FPC1 approximately 20 centimeters long from the connector 19 on the first circuit board to the DSP 15 on the second circuit board 18 by way of the connectors 20, 21 mounted on these first and second circuit boards, then meeting the SATA communication standards might be impossible if there is large transmission loss and reflection loss on the transmission path.

However, SATA is an external interface signal so the SATA transmission path must constantly stay in communication with the host even if there is a shift in the position of the disc tray 14 due to loading or removal of the disc as shown in FIG. 6A, FIG. 6B, FIG. 7A, FIG. 7B, FIG. 8A, and FIG. 8B. The FPC1 must provide transmission characteristics that pass SATA compliance test even if for example there is a shift in the position of the disc tray 14 as shown in FIG. 9 causing contact between the movable unit 3 of the FPC and the nearby metal (case 13 and case cover 22, tray backside metal plate 23). However, the transmission characteristics of the differential line 4 of FPC1 fluctuate at this time because of capacitive coupling in sections in contact with nearby metal. Due to these fluctuations in transmission characteristics, the FPC1 might fail to pass SATA compliance test because of the position of the disc tray 14.

The parameters for the differential line width 10 and the differential line gap 9 on the fixed unit 2 and the movable unit 3 are the same design as in a conventional FPC1 in a disc tray pullout type optical disc drive consisting of the first and the second structure. In other words, the area around the boundary of the fixed unit 2 and the movable unit 3 is comparable to the line pattern as shown in FIG. 19. Moreover if sending a high speed signal such as SATA in the second structure, then the transmission loss must be as low as possible so a differential 100 ohm (impedance) path was obtained by a design that widens the differential line width 10 and also the line width 9 on the first circuit board.

Fabricating a 100 ohm differential circuit FPC1 with a fixed differential line gap 9 in the fixed unit 2 and the movable unit 3 in this way forms a differential line with a wide line width in the movable unit 3 as shown in FIG. 20. This wide line width tends to form capacitive coupling between the nearby metal and the differential line 4 of the movable unit so the transmission characteristics might deteriorate.

An objective of the present invention is to suppress fluctuations in transmission characteristics caused by contact between the movable unit and nearby metal even when there is a change in the disc tray position in a FPC including a fixed unit and a movable unit such as an electronic device typified by the above disc tray pullout type optical disc drive.

Examples of typical aspects of this invention are given as follows.

The flexible printed circuit according to an aspect of the present invention utilized as a circuit board in electronic devices and capable of changing shape includes: a fixed unit clamped to at least either a first case or to a second case formed so as to change position relative to a first case, and a movable unit capable of changing shape due to a change in the relative positions of the first case and the second case; and the fixed unit and the movable unit further include one or more differential lines, and in which the line gap of the differential line in the movable unit is narrower than the line gap of the differential line in the fixed unit.

The electronic device according to another aspect of the present invention includes; a first case including a first circuit board, a second case including a second circuit board, a mechanism to change the relative positions of the first case and the second case, and a flexible printed circuit capable of changing shape and electrically connected to the first circuit board and the second circuit board, in which the flexible printed circuit includes a fixed unit clamped to a least one of either the first or the second case, and a movable unit capable of changing shape due to a change in the relative positions of the first case and the second case; and in which the fixed unit and the movable unit respectively include at least one more differential lines, and the line gap of the movement unit differential line is narrower than the line gap of the fixed unit differential line.

The optical disc drive according to still another aspect of the present invention also includes at least a mechanism to read data or to write data on an optical disc using laser light; and further includes a first case including a first circuit board, a second case including a second circuit board, and a disc tray for mounting the optical disc, mechanism to change the relative positions of the first case and the second case, and a flexible printed circuit capable of changing shape and electrically connected to the first circuit board and the second circuit board, and in which the first circuit board includes a SATA (Serial Advanced Technology Attachment) connector as the external interface standard; and the second circuit board includes DSP (digital signal processor) to process SATA signals as the external interface signal supporting SATA compliance standards; the flexible printed circuit includes a fixed unit clamped to at least either the first and the second case, and a movable unit with a shape that varies due to a change in the relative positions of the first case and the second case; and the fixed unit and the movable unit respectively include at least one or more differential lines for sending SATA signals, and the line gap of the movable unit differential line is narrower than the line gap of the fixed unit differential line.

This invention provides an electronic device including a mechanism to change the relative positions of the two circuit boards, and a FPC electrically connecting the two circuit boards and further including a fixed unit and a movable unit, capable of providing a flexible printed circuit capable of stable transmission characteristics even when the circuit board position changes, and an optical disc drive as well as an electronic device utilizing that flexible printed circuit.

DETAILED DESCRIPTION OF THE PREFERRED EMBODIMENTS

Figure 1:
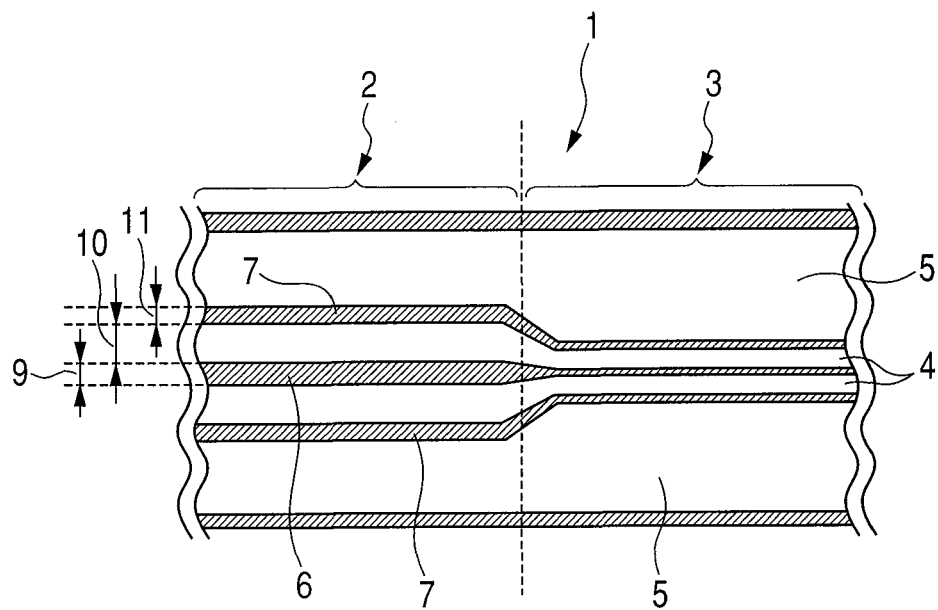
FIG. 1 is a drawing showing the wiring pattern of the differential line near boundary of the movable unit and the fixed unit of the flexible printed circuit of this invention, when the wiring includes low impedance lines such as power and ground lines adjacent to the differential line.

The flexible printed circuit of this invention for an electronic device including a first case including a first circuit board, a second case including a second circuit board, and a mechanism to change the relative positions of the first case and the second case, and the flexible printed circuit electrically connects to the first circuit board and the second circuit board, and in which the flexible printed circuit includes: a fixed unit clamped to a least one of either the first or the second case, and a movable unit capable of changing shape due to a change in the position relative to the case; and including at least one or more differential lines, and the line gap of the movement unit is narrower than the line gap of the fixed unit differential line.

More specifically, the flexible printed circuit of this invention is a flexible printed circuit with a variable shape utilized as the circuit board in electronic devices, and includes a fixed unit clamped to at least either of a first case and a second case structure so as to change position relative to the first case in the electronic device and a movable unit capable of changing shape due to a change in the position relative to the first case and the second case; and the fixed unit and the movable unit each include at least one or more differential lines; and the line gap of the differential lines in the movable unit is narrower than the line gap of the differential lines in the fixed unit.

The differential characteristic impedance of the differential line in the fixed unit is preferably a value within ±10 percent of the reference impedance, and the differential characteristic impedance of the differential line in the movable unit is a value within −10 to +30 percent of the reference impedance in a state where the movable unit does not contact the first and the second case, and the reference impedance is a differential characteristic impedance established for at least either the specifications or the standards of the differential signal to be sent, or is the differential input or differential output impedance of either the input or the output circuits on the differential signal transmission circuit. The differential characteristic impedance on the fixed unit and the movable unit may also preferably be value within a range from 90 to 110 ohms on the fixed unit, and a value within a range from 90 to 130 ohms on the movable unit in a state in which the movable unit is not in contact with the first and second case.

The line gap of the differential lines on the fixed unit and the movable unit is preferably a value within a range from 100 to 500 μm on the fixed unit, and more preferably a value within a range from 50 to 130 μm on the movable unit.

The boundary position at which the line gap changes on the flexible printed circuit is preferably set within ±10 percent of the length of the entire flexible printed circuit from the boundary between the fixed unit and the movable unit.

The line width of the differential line on an optional section on the movable unit is preferably narrower than on other sections on the movable unit, and the line width on the movable unit includes at least two or more types. The optional section position is preferably the position where the movable unit contacts at least either the first or the second case along with the change in relative positions of the first case and second case.

Alternatively, the line gap on the optional section of the movable unit may be narrower than other sections on the movable unit, and the line gap on the movable unit preferably include at least two or more types. In that case, the position of the optional section is preferably a position where the movable unit contacts at least either the first or the second case along with the change in relative positions of the first case and second case.

In the flexible printed circuit of this invention, the lines adjacent to the differential lines preferably are low impedance lines including the power line or the ground line. In such cases, the line gap between the differential line and the low impedance line is preferably a value within a range from 100 to 500 μm on the fixed unit, and a value within a range from 50 to 130 μm on the movable unit. Even more preferably, the line gap between the differential line and the low impedance line is equivalent to the line gap of the differential lines.

The electronic device of this invention on the other hand, includes a first case including a first circuit board, a second case including at least either a second circuit board, a mechanism to change the relative positions of the first case and the second case, and a flexible printed circuit with a variable shape and electrically connecting to the first circuit board and the second circuit board, and the flexible printed circuit includes any of the above features.

In the electronic device of this invention, the differential characteristic impedance of the differential line of the fixed unit is preferably a value within ±10 percent of the reference impedance, and the differential characteristic impedance of the differential line of the movable unit is a value within −10 to +30 percent of the reference impedance in a state where the movable unit does not contact the first case and the second case; and the reference impedance is a differential characteristic impedance established for at least either the specifications or standards of the differential signal to be sent, or is the input or the differential output impedance of either the input or the output circuits on the differential signal transmission circuit.

The optical disc drive of this invention includes a mechanism to at least either read data or write data on an optical disc using laser light and includes a first case including a first circuit board, a second case including a second circuit board, a disc tray for setting the optical disc, a mechanism to change the relative positions of the first case and the second case, and a flexible printed circuit with a variable shape and electrically connecting to the first circuit board and the second circuit board, and the flexible printed circuit includes any of the above features. The first printed circuit board in particular includes a SATA (Serial Advanced Technology Attachment) connector as the external interface standard, and the second circuit board includes a digital signal processor to process SATA signals as the external interface signal supporting SATA compliance standards; and the one or more differential lines within the fixed unit and the moving unit are differential lines for transmitting the respective SATA signals.

In the optical disc drive of this invention, the differential characteristic impedance of the differential line of the fixed unit and the movable unit is preferably a value within a range from 90 to 110 ohms on the fixed unit, and a value within a range from 90 to 130 ohms on the movable unit in a state where the movable unit is not in contact with the first and second case.

The embodiments for implementing this invention are described next while referring to the drawings. Sections relating to the present invention are shown as diagrams within the drawings however sections not relating to the present invention such as the laser pickup on the optical disc drive as well as other circuit components are omitted and information relating to the shapes and dimensions shown in the drawings is summarized.

First Embodiment

FIG. 1 is a drawing showing the FPC wiring pattern of the first embodiment of the present invention. This drawing shows the differential line gap 9 9, the differential line width 10 and the gap 11 between the differential line 4 and ground near the boundary of the movable unit 3 and the fixed unit 2 on the FPC1.

Figure 6A:
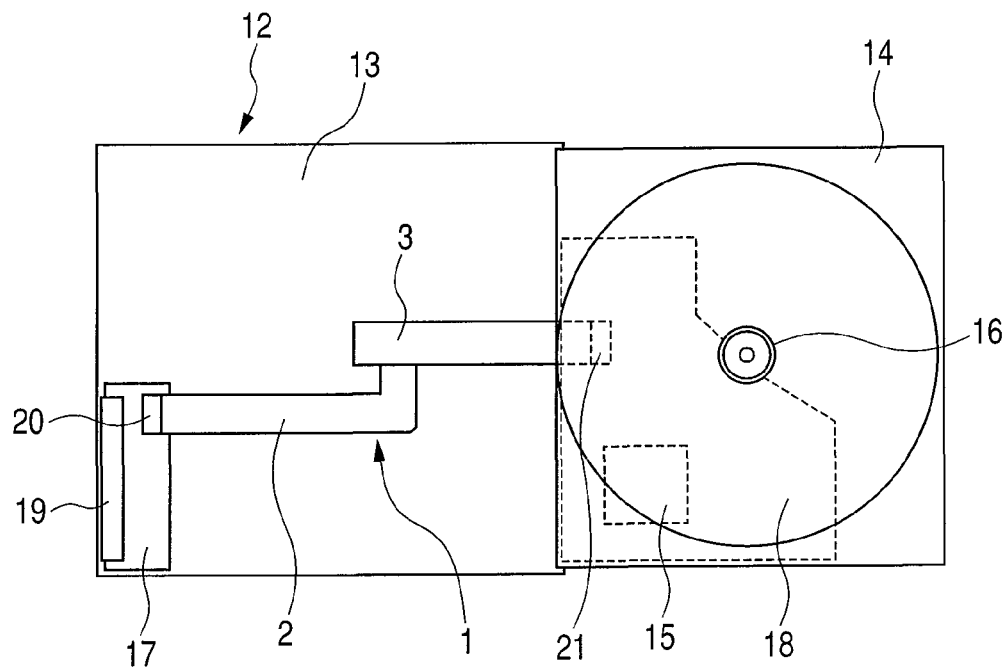
FIG. 6A is a flat view of the third structure of the disc tray pullout type optical disc drive when the disc tray is pulled fully outwards.
Figure 6B:
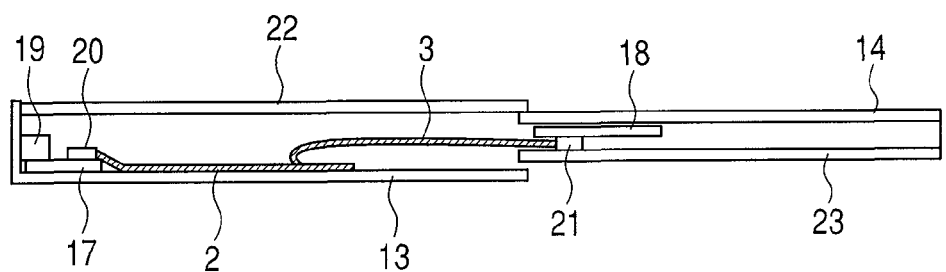
FIG. 6B is a side view of the third structure of the disc tray pullout type optical disc drive when the disc tray is pulled fully outwards.
Figure 7A:
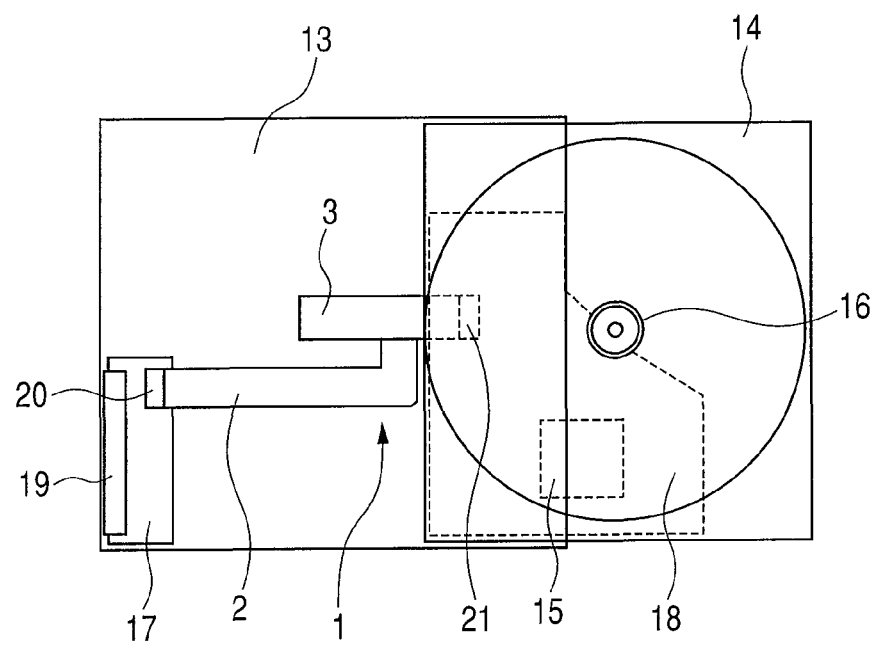
FIG. 7A is a flat view of the third structure of the disc tray pullout type optical disc drive with the disc tray largely housed within the unit.
Figure 7B:
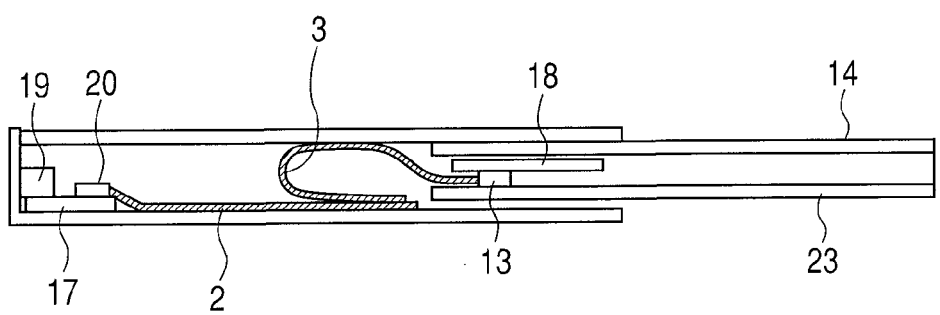
FIG. 7B is a side view of the third structure of the disc tray pullout type optical disc drive with the disc tray largely housed within the unit.
Figure 8A:
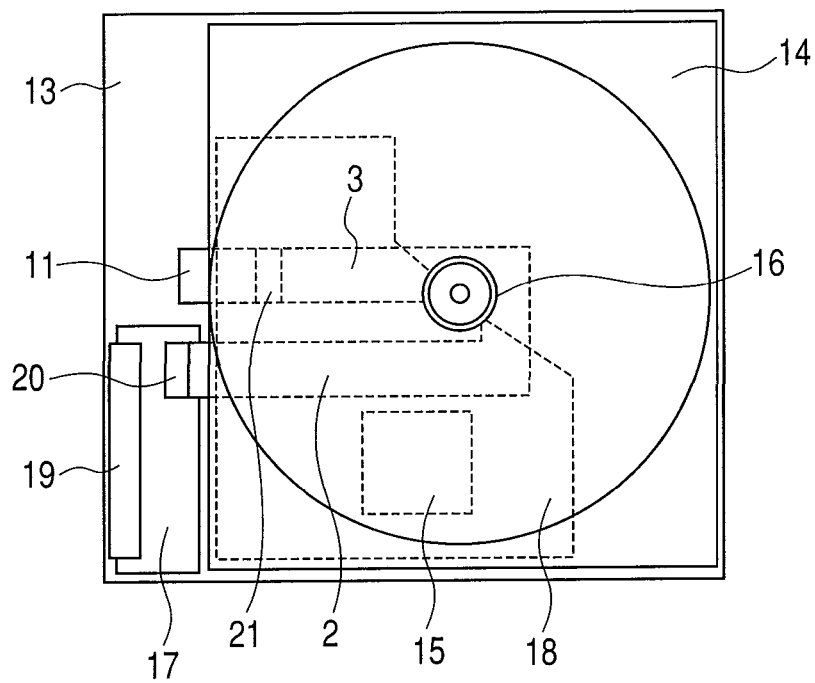
FIG. 8A is a flat view of the third structure of the disc tray pullout type optical disc drive with the disc tray fully housed within the unit.
Figure 8B:
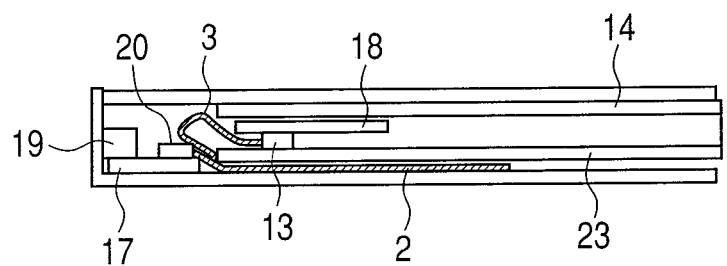
FIG. 8B is a side view of the third structure of the disc tray pullout type optical disc drive with the disc tray fully housed within the unit.
Figure 9:
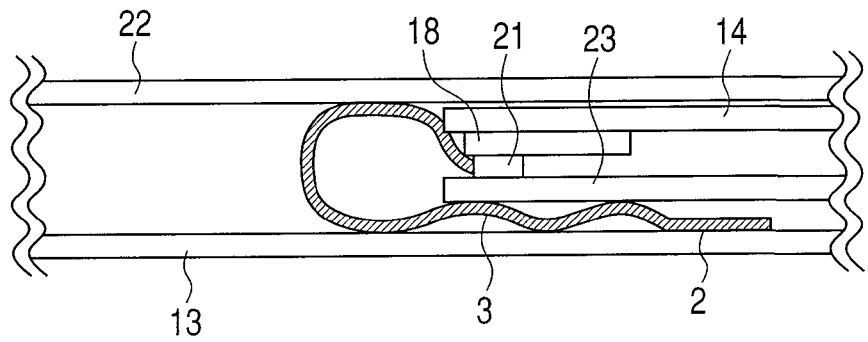
FIG. 9 is an enlarged side view of the vicinity of the flexible printed circuit in a state where the disc tray largely housed within the unit in the third structure of the disc tray pullout type optical disc drive.

The above FPC1 adapted for the optical disc drive of FIGS. 6A and 6B is shown below.

The FPC1 is connected to send the SATA differential signal input from the external interface connector 19. And the FPC1 is connected from the first circuit board 17 to the second circuit board 18. The FPC 1 consists of a fixed unit 2 on the FPC clamped to the case 13 by adhesive tape (not shown in drawing); and a movable unit 3 on the FPC whose shape changes according to the change in position relative to the disc tray 14.

The differential line gap 9 9 in the fixed unit 2 is designed wide in order to lower transmission loss, and the differential line width 10 is also designed so as to set the characteristic impedance to 100 ohms to account for the thickness of the adhesive tape. On the movable unit 3 in the FPC on the other hand, the differential line gap 9 9 is designed narrower than that on the fixed unit 2 in the FPC and the differential characteristic impedance is set to 100 ohms.

The SATA signal line in this embodiment includes two pairs of differential lines for transmitting and receiving. However, FIG. 1 shows only one differential line, and the present invention can apply to either of the two pairs. A ground (or GND) line is also prepared adjacent to each differential line pair but may also be a low impedance line such as the power line. In such cases, the impedance of the adjacent lines is preferably equivalent in order to prevent deterioration in the differential line 4 balance. The SATA input and output differential impedance is specified as 100 ohms and the SATA signal can be sent most efficiently by setting the characteristic impedance of the differential line 4 to 100 ohms.

The electromagnetic field in the above embodiment structure tends to concentrate in the differential line of movable unit 3 more than the structures of the related art so fluctuations in the differential characteristic impedance can be suppressed even if the movable unit 3 makes contact with nearby metal.

Figure 10A:
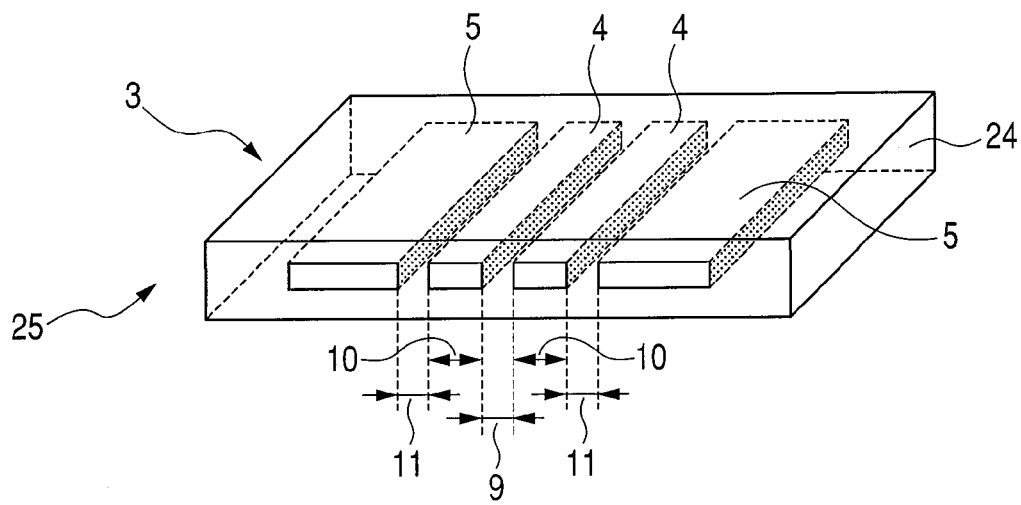
FIG. 10A is a line model used to calculate the relation between the line gap of the differential line, and the change in impedance due to effects from nearby metal; and shows a model of the movable unit when there is no nearby metal or in other words the disc tray is pulled fully outwards.
Figure 10B:
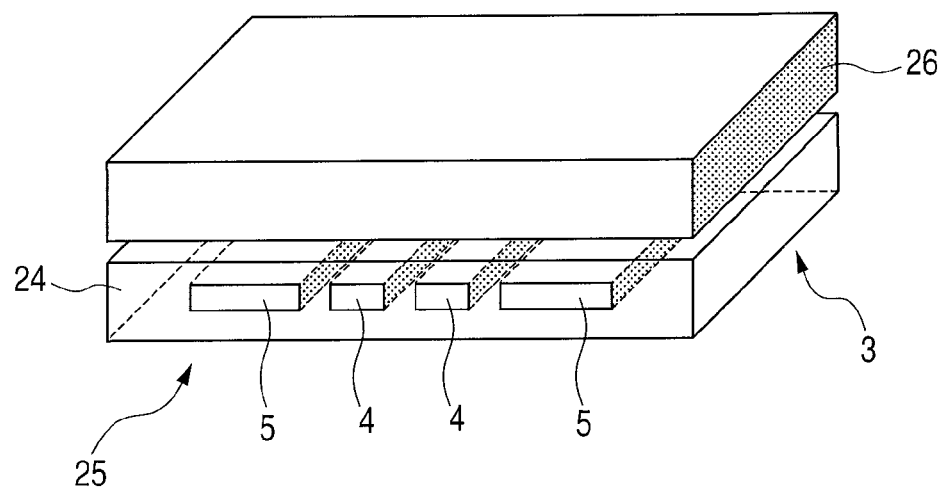
FIG. 10B is a line model used to calculate the relation between the line gap of the differential line, and the change in impedance due to effects from nearby metal; and shows a model of the movable unit when close to nearby metal or in other words, the disc tray is housed in the unit.

The movable unit 3 was substituted into the simple models shown in FIG. 10A and FIG. 10B in order to clarify the relation between the differential characteristic impedance, and the differential line gap 9 and the differential line width 10, and the effect from the nearby metal. The differential characteristic impedance was calculated by performing 3-dimensional electromagnetic analysis on this model. The same calculation was also performed for the fixed unit 2 (figure for fixed unit model is not shown). The size and materials utilized in the following calculation are merely examples, and the calculation results are only for verifying the interrelation of the above parameters and the differential characteristic impedance.

FIG. 10A is a drawing showing the state with no nearby metal, while FIG. 10B is the state when the metal plate 26 is 50 μm away from the surface of the FPC cover 24. Both FIG. 10A and FIG. 10B show the copper pattern of the differential line 4, and ground line on both sides of the differential line 4. The line thicknesses are both 18 μm. The thickness of the FPC cover was 62.5 μm, and was polyimide with a dielectric constant of 3.5, and the differential characteristic impedance is calculated from the differential line gap 9 and differential line width 10 parameters of differential line 4. The line gap 9 and the gap 11 between the differential line and ground were calculated here with the same values.

Figure 11:
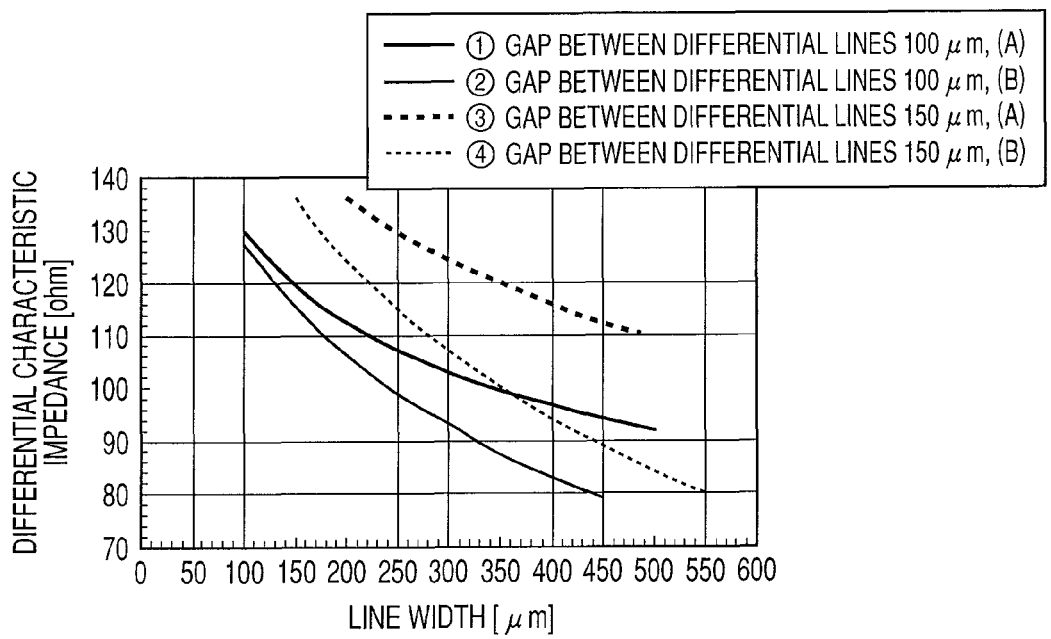
FIG. 11 is a graph comparing the relation of differential characteristic impedance and line width of the differential line, for each differential line gap 9 of the differential line in cases where there is or is no nearby metal.

FIG. 11 shows the result when the differential characteristic impedance was calculated at line gaps of 100 μm and 150 μm under the conditions in FIGS. 6A and 6B. Examining the figure reveals that the narrower the line gap, the smaller the change in differential impedance due to nearby metal.

Figure 12:
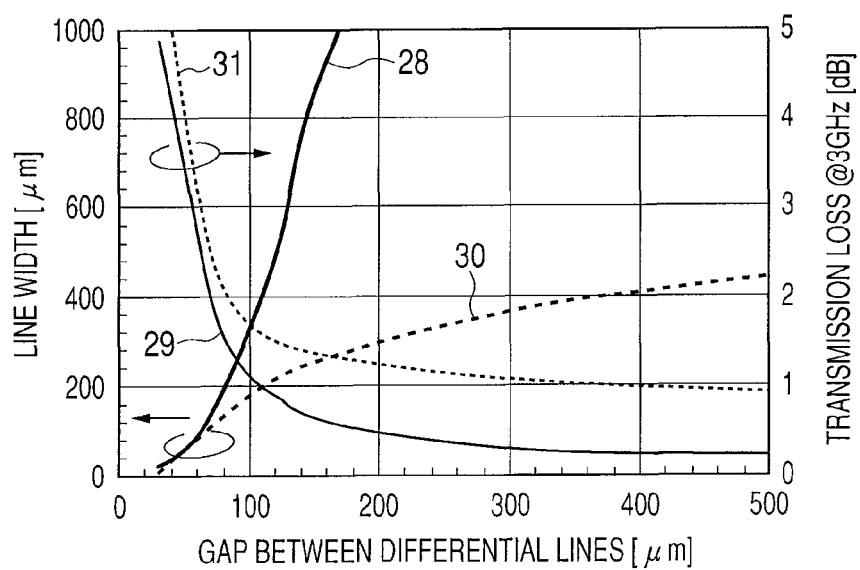
FIG. 12 is a graph showing the relation between the line width and the line gap when the differential characteristic impedance of the differential line is 100 ohms, and also the relation between the line gap and transmission loss at 3 GHz when the differential line length is 20 cm, when satisfying the above relation between the line width and line gap in the movable unit and the fixed unit of the FPC.

FIG. 12 shows the relation between the differential line gap 9 and the differential line width 10 in order for the differential characteristic impedance to reach 100 ohms on the differential line in the fixed unit and movable unit, as well as the transmission loss when the differential line length is 20 cm at 3 GHz. Examining this figure reveals that the narrower the differential line gap 9, the more the differential line width 10 must be narrowed when aiming for a specific differential characteristic impedance which causes a larger transmission loss.

Namely, when sending a high speed signal along a transmission circuit such as in FIG. 6A and FIG. 6B, the transmission loss can be reduced by widening the differential line gap 9, and enlarging the differential line width 10 in the fixed unit 2 whose degree of contact with nearby metal does not change; and narrowing the differential line gap 9 and also narrowing the differential line width 10 is effective in the movable unit 3 for reducing effects from contact with nearby metal.

An actual example is described next for the values of the differential line gap 9 and the differential line width 10 based on results from an experiment performed by the inventors themselves in order to verify the effects of the above embodiment. The numerical figures and materials shown here are merely examples and the present invention is not necessarily limited by these examples.

A disc tray pullout type optical disc drive as shown in FIG. 6A and FIG. 6B is provided and includes: a first printed circuit board 17 clamped to the case 13, a FPC1 electrically connected to a second printed circuit board 18 clamped to the disc tray 14, a SATA connector 19 serving as the external interface and a first connector 20 electrically connecting to the FPC1 on the first printed circuit board 17, a second connector 21 to electrically connect the FPC1 and DSP 15 on the second circuit board 18. The transmission characteristics of the FPC mounted in the present invention and the FPC of the related art were compared in this device and the effect of this embodiment verified.

Figure 20:
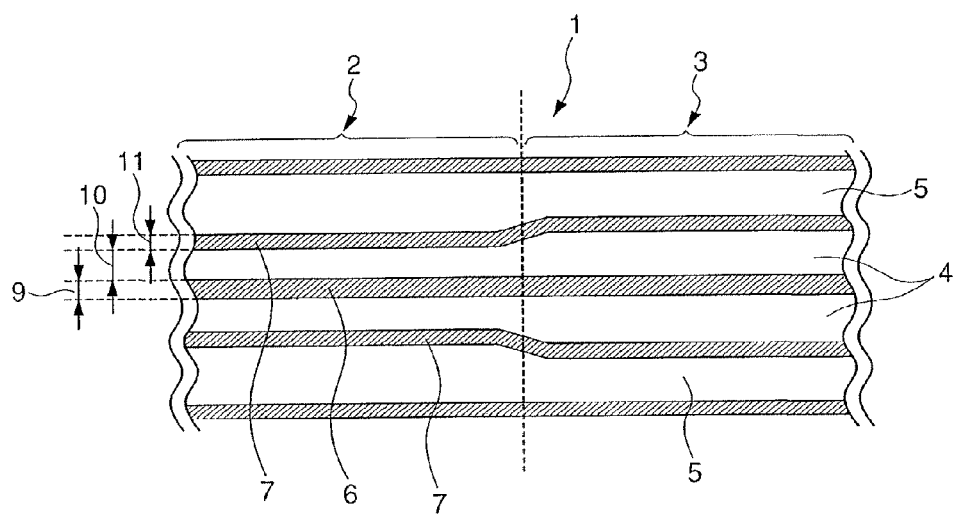
FIG. 20 is a drawing of the wiring pattern of the differential line structure of the related art near the movable unit and the fixed unit of the flexible printed circuit, showing a structure in which the line gap is fixed in the fixed unit and the movable unit and the differential line and the adjacent ground line are wired.

In the structure of the differential line of the related art shown in FIG. 20, the line gaps in the movable unit 3 and the fixed unit 2 of FPC1 are equivalent lengths and their gaps are 150 μm, the differential line width 10 in the fixed unit 2 is 265 μm, and is 570 μm in the movable unit 3. Measurement results for differential characteristic impedance, differential return loss, and differential transmittance characteristics when utilizing this structure are shown according to the disc tray 14 position in FIG. 13A, FIG. 14A, and FIG. 15A. Measurements were made for the five positions of disc tray 14 as: (1) fully housed state, (2) pulled out only ¼ state, (3) pulled out only ½ state, (4) pulled out only ¾ state, and (5) fully pulled out state.

Figure 14A:
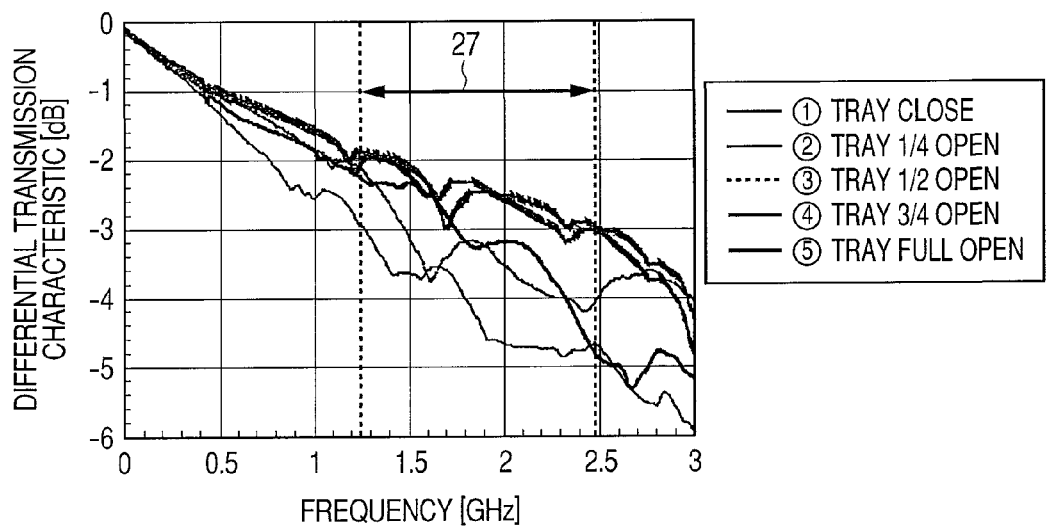
FIG. 14A is a graph showing actual measurement values of differential transmittance characteristics on the differential line from the external interface connector to the DSP, when the FPC of FIG. 13A is mounted in the optical disc drive of the third structure of FIG. 6A and FIG. 6B.
Figure 15A:
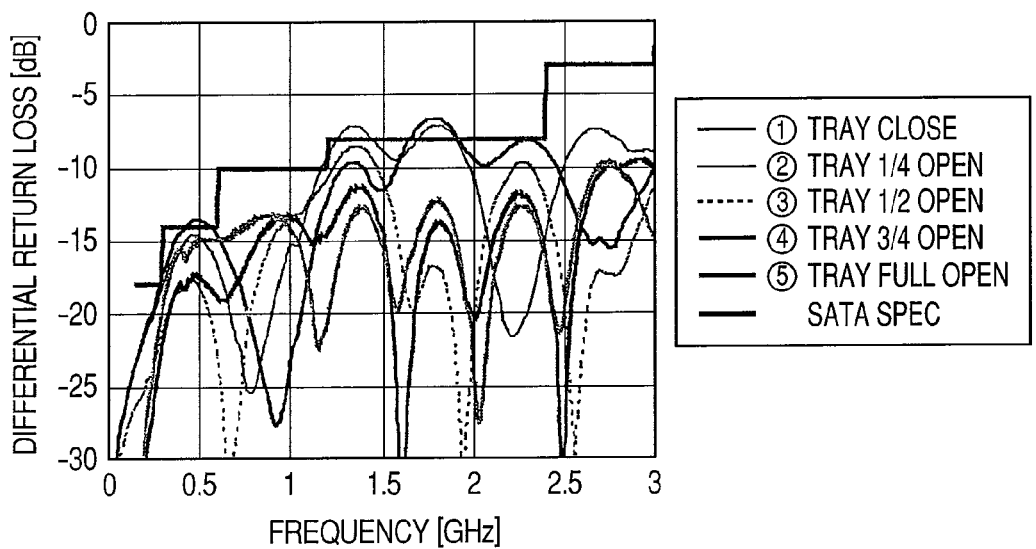
FIG. 15A is a graph showing actual measurement values of differential return loss on the differential line from the external interface connector when the FPC of FIG. 13A is mounted in the optical disc drive of the third structure of FIG. 6A and FIG. 6B.

In the state where the disc tray 14 is fully pulled out as shown in FIG. 6A and FIG. 6B, or namely in a state where the movable unit 3 in position (5) is not in contact with nearby metal, the reflectance loss is minimal as shown in (5) of FIG. 15A and SATA communications standards are satisfied, and 3 dB band (means the frequency in the case that the transmittance loss is −3 dB) of the transmittance characteristics are best as shown in (5) of FIG. 14A. This result is obtained because the movable unit 3 of FPC is not affected by nearby metal, so that the differential impedance of the differential line is in a state near 100 ohms.

Figure 13A:
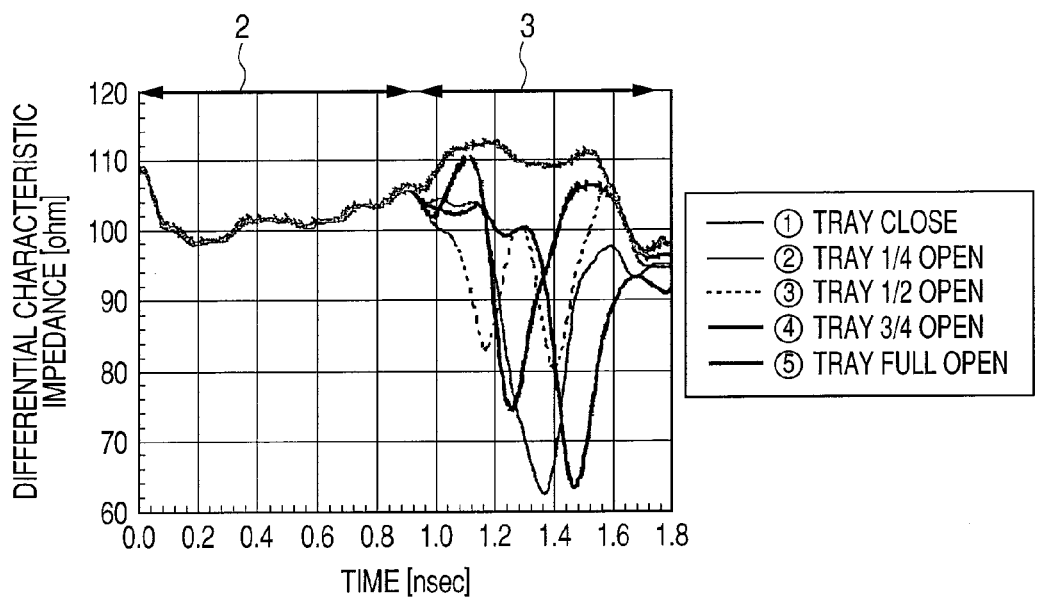
FIG. 13A is a graph showing results from measuring the impedance of the movable unit and the fixed unit of the FPC by TDR (Time Domain Reflectometry) when the line gap of the FPC is 150 μm.

However, the differential characteristic impedance of the differential line in the movable unit 3 drops from 100 ohms to 67 ohms as the disc tray becomes housed as in (1) through (4) as shown in FIG. 13A. The differential return loss shown in FIG. 14A is under conditions that do not satisfy SATA communication standards. The differential transmittance characteristic of the 3 dB band moreover changes from 33 GHz to 1.25 GHz. This drastic fluctuation in transmission characteristics due to the disc tray position is a phenomenon that cannot be ignored when one considers the SATA communication standards and the SATA signal transmission speed more than 1.5 Gbps.

Figure 13B:
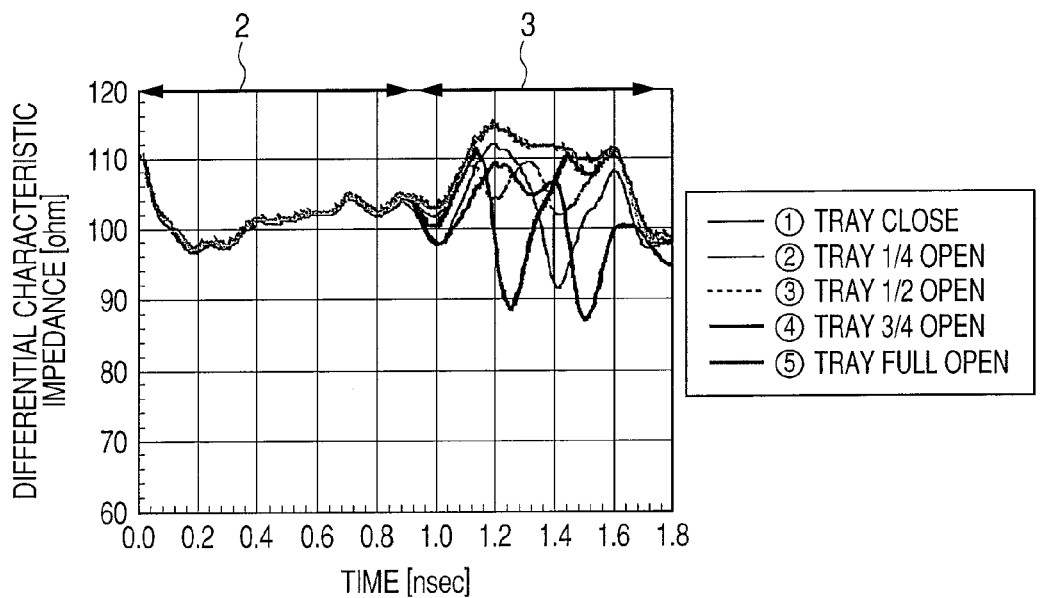
FIG. 13B is a graph showing the results from measuring the impedance of the movable unit and the fixed unit of the FPC by TDR when the line gap of the FPC is 100 μm.
Figure 14B:
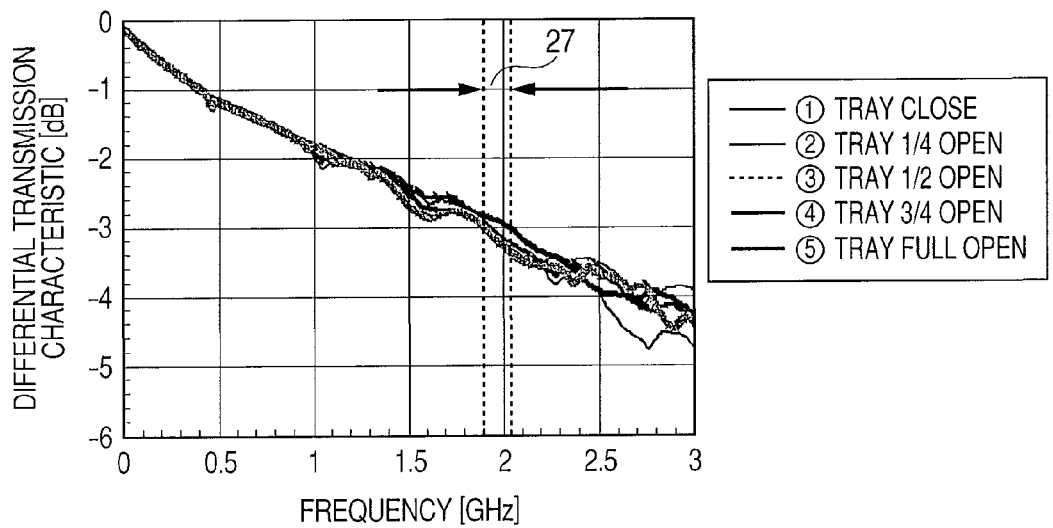
FIG. 14B is a graph showing actual measurement values of differential transmittance characteristics on the differential line from the external interface connector to the DSP, when the FPC of FIG. 13B is mounted in the optical disc drive of the third structure of FIG. 6A and FIG. 6B.
Figure 15B:
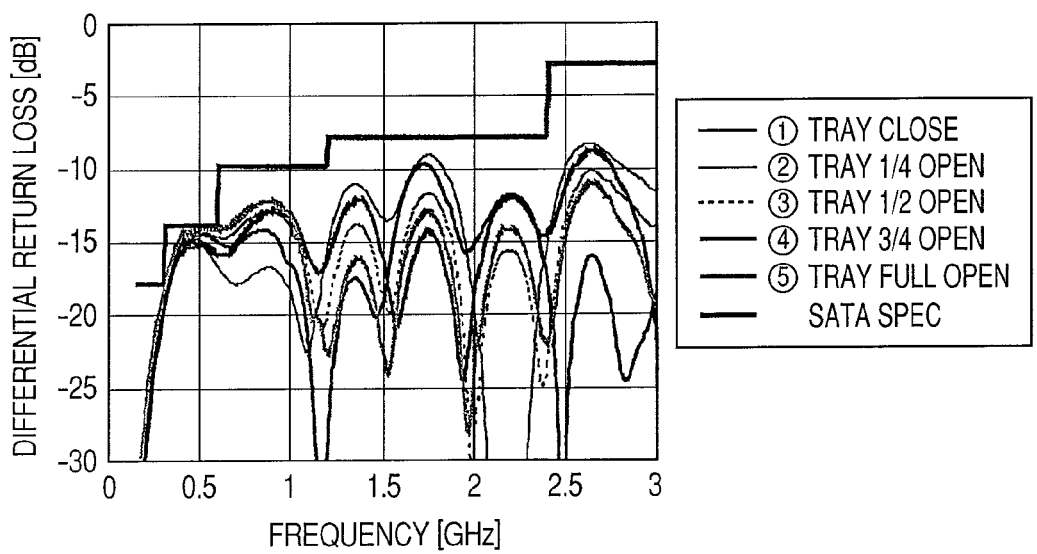
FIG. 15B is a graph showing actual measurement values of differential return loss on the differential line from the external interface connector when the FPC of FIG. 13B is mounted in the optical disc drive of the third structure of FIG. 6A and FIG. 6B.

The FPC for the present embodiment on the other hand was set to a line gap of 150 μm, and a line width of 265 μm, in the fixed unit; and a line gap of 100 μm, and line width of 245 μm in the movable unit. FIG. 13B, FIG. 14B, and FIG. 15B show measurement results of the differential characteristic impedance, differential return loss, differential transmittance characteristic in this case. In spite of the fact that the differential characteristic impedance is largely the same as the related art structure when the disc tray position is at (5), or in other words completely pulled out, fluctuations in each characteristic due to the disc tray position can be suppressed to a greater extent than the structure of the related art.

The present embodiment therefore renders the effect of suppressing fluctuations transmission characteristics of the movable unit 3 in FPC1 due to the position of the disc tray 14, and provides stable SATA communication.

However there is little possibility of improving the transmission loss even if the differential line gap 9 is widened to 500 μm or more, and the differential line width 10 must be widened to form a line of approximately 100 ohms which increases the FPC surface area leading to a longer line length. Conversely, making the differential line gap 9 narrower than 50 μm requires sharply narrowing the differential line width 10 which drastically increases the transmission loss.

Therefore, in this embodiment, the differential line gap 9 of the fixed unit 2 is preferably a value in a range from 100 to 500 μm, and the differential line gap 9 of the movable unit 3 is a value in a range from 50 to 130 μm.

The boundary line where the differential line gap 9 and the differential line width 10 change may be approximately 10 percent of the total length of the FPC and is not limited to the fixed unit 2 and the movable unit 3 boundaries. In this case, caution is needed since transmission characteristics may deteriorate due to effects from impedance mismatches and fluctuations.

The FPC1 utilized in the present embodiment had an approximate U shape however the FPC is not limited to this shape, and the same effect may for example be rendered by a straight type FPC where the fixed unit 2 and the movable unit 3 overlap when the disc tray is housed within the unit. A FFC (Flexible Flat Cable) may be utilized instead of the FPC1 and will render the same effect even if the fixed unit 2 and the movable unit 3 utilize the same structure.

In FIG. 1, the differential line width 10 of fixed unit 2 is wider than in the movable unit 3 however, the differential line width 10 may be made thinner than the differential line width 10 of the movable unit 3 due to the differential line gap 9 of the fixed unit 2, and adhesive tape for affixing the FPC 1 to the case 13 or the type and thickness of material fulfilling the same function.

Moreover, the FPC1 utilized in the present embodiment a structure including a power line layer or at least one or more ground line layers above or below any of the differential line 4 layers. In other words, a FPC of two or more layers is satisfactory but the flexibility and durability of the FPC decrease drastically so that a structure preferably consists of one FPC layer including only a differential line 4 layer.

Second Embodiment

The second embodiment of this invention is described next while referring to FIG. 2.

Figure 2:
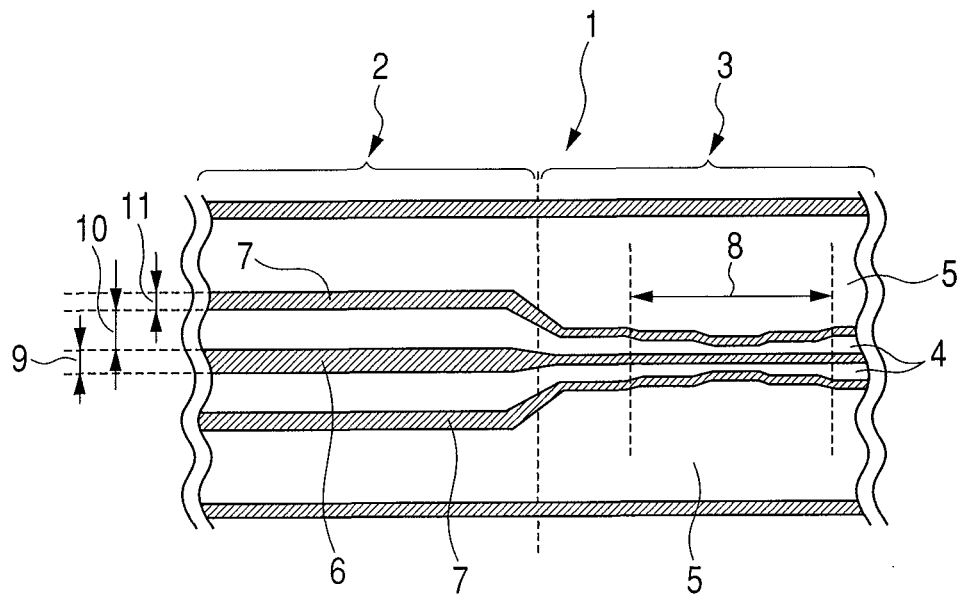
FIG. 2 is a drawing showing the wiring pattern of the differential line near boundary of the movable unit and the fixed unit of the flexible printed circuit of this invention in an example in which the line width narrows in sections of the movable unit contacting the nearby metal; and the wiring includes low impedance lines such as power and ground lines adjacent to the differential line.

FIG. 2 shows the fixed unit 2 and the movable unit 3 of a FPC1 identical to FIG. 1. Of these two units, the movable unit 3 further includes a narrower differential line width 10 at an optional position. In all other respects the structure is identical to the first embodiment shown in FIG. 1.

In the second embodiment the line gap of the movable unit 3 is narrower than that of the fixed unit 2 so that fluctuations in transmission characteristics due to effects from nearby metal can be suppressed the same as in the first embodiment and rendering the effect of stable transmission characteristics. These effects are obtained for the same reasons as in the first embodiment. Moreover, even though differential characteristic impedance characteristic is high in the section in the movable unit 3 with the narrowed line width, fluctuations in the transmission characteristics can be suppressed even more effectively than in the first embodiment.

The section where the line width narrows may be varied in steps, the location and the number of steps is optional but is preferably a location where the movable unit 3 predicted to easily contact the nearby metal.

Therefore, in the present embodiment where the FPC includes a fixed unit and movable unit, fluctuations in the transmission characteristics can be suppressed even if the shape of the movable unit changes, rendering the effect that stable transmission characteristics are obtained.

Third Embodiment

The third embodiment of this invention is described next while referring to FIG. 3.

Figure 3:
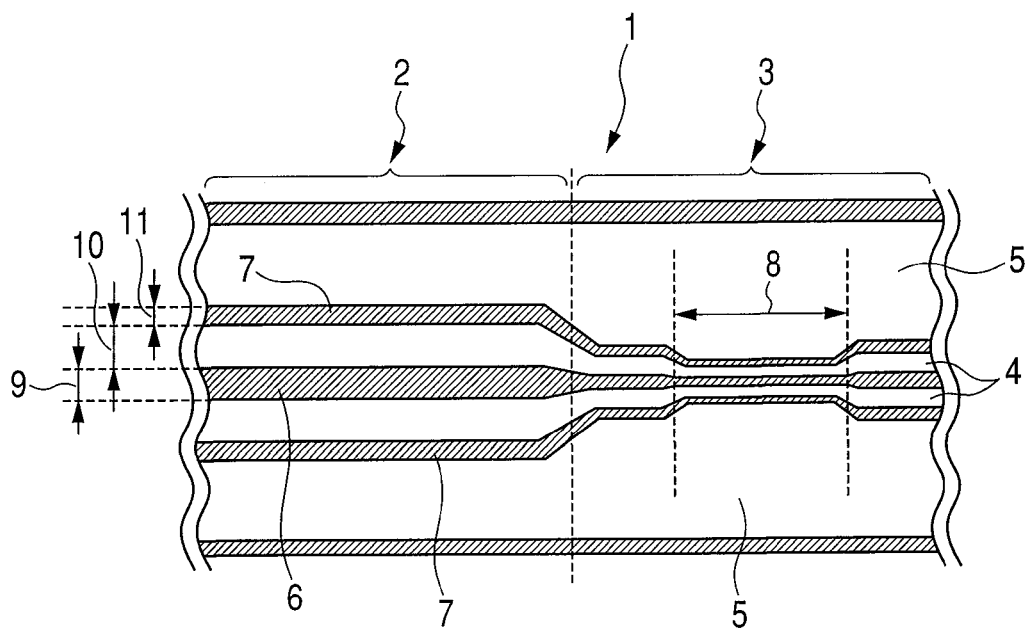
FIG. 3 a drawing showing the wiring pattern of the differential line near the movable unit and the fixed unit of the flexible printed circuit of this invention in an example in which the line gap narrows in sections of the movable unit contacting the nearby metal; and the wiring includes low impedance lines such as power and ground lines adjacent to the differential line.
Figure 4:
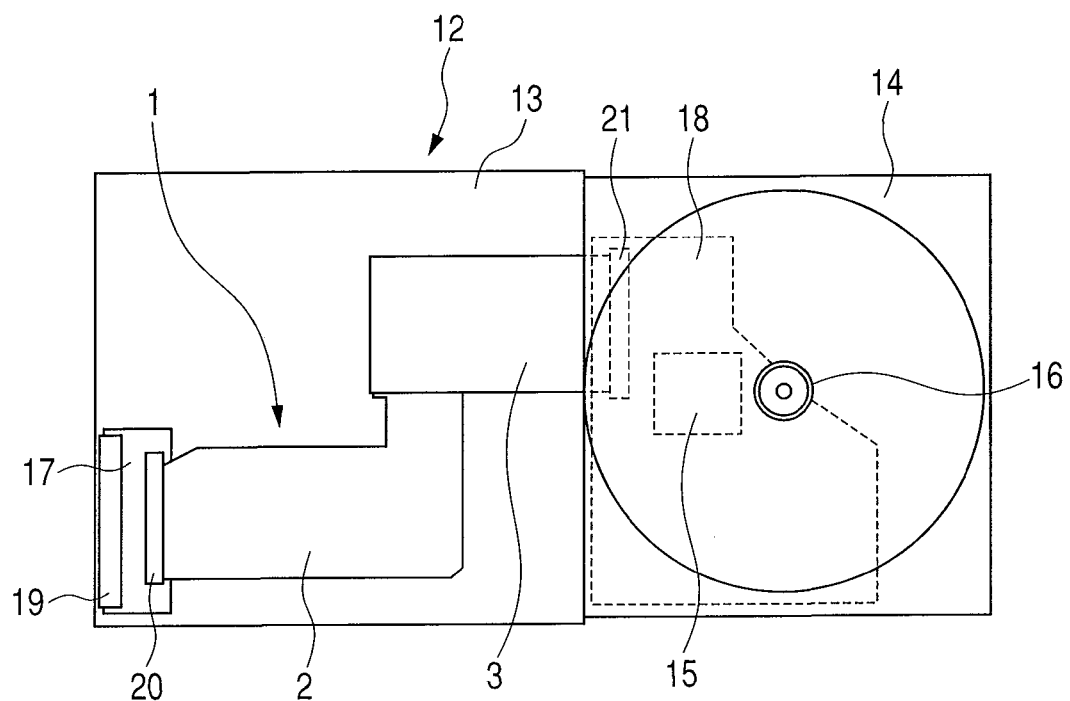
FIG. 4 is a flat view of the first structure of the disc tray pullout type optical disc drive.
Figure 5:
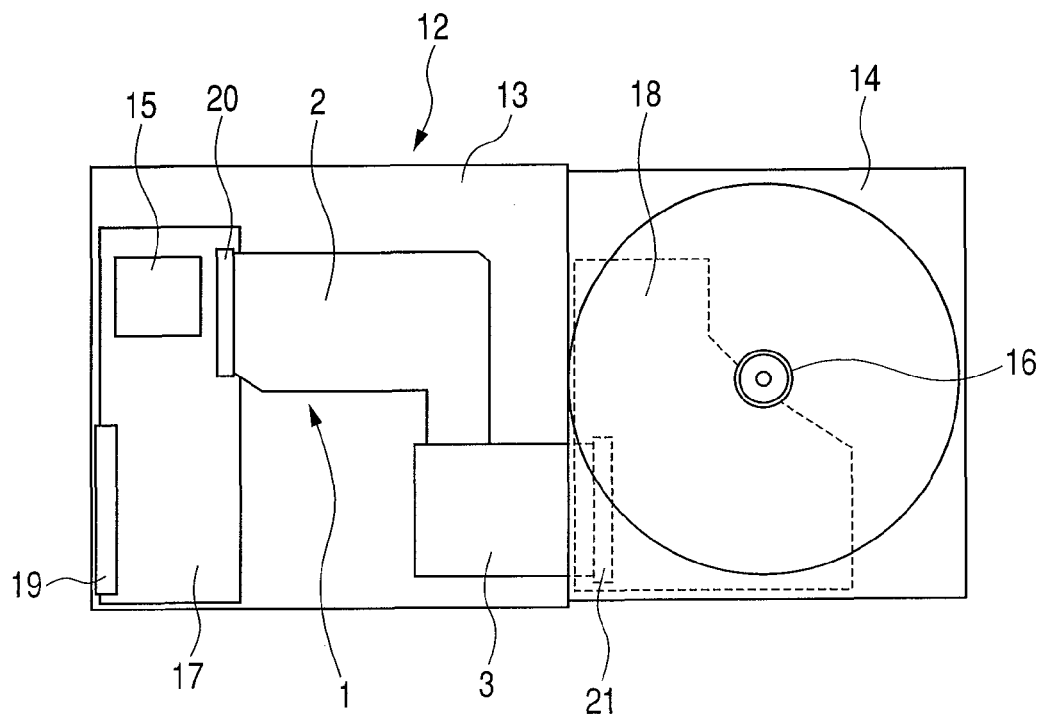
FIG. 5 is a flat view of the second structure of the disc tray pullout type optical disc drive.

FIG. 3 shows the fixed unit 2 and the movable unit 3 of a FPC1 identical to FIG. 1. Among these units, the differential differential line gap 9 can be further narrowed at an optional position on the movable unit 3, and moreover the line gap 10 is narrowed to obtain uniform differential impedance, and suppress capacitive coupling with the nearby metal. In all other respects the structure is identical to the first embodiment shown in FIG. 1.

In the third embodiment, the differential line gap 9 in the movable unit 3 is narrowed so that fluctuations in transmission characteristics due to contact with nearby metal can be suppressed and rendering the effect of stable transmission characteristics the same as in the first and second embodiments. These effects are obtained for the same reasons as in the first and the second embodiments. Fluctuations in transmission characteristics can be suppressed more than in the first embodiment since the differential line gap 9 and differential line width 10 are narrowed in the movable unit 3. The differential characteristic impedance moreover does not become large which provides the advantage of easy (impedance) matching when there is no nearby metal as in the second embodiment.

Therefore, in the present embodiment where the FPC includes a fixed unit and movable unit, fluctuations in the transmission characteristics can be suppressed even if the shape of the movable unit changes, rendering the effect that stable transmission characteristics are obtained.

Fourth Embodiment

The fourth embodiment of this invention is described next while referring to FIG. 16.

Figure 16:
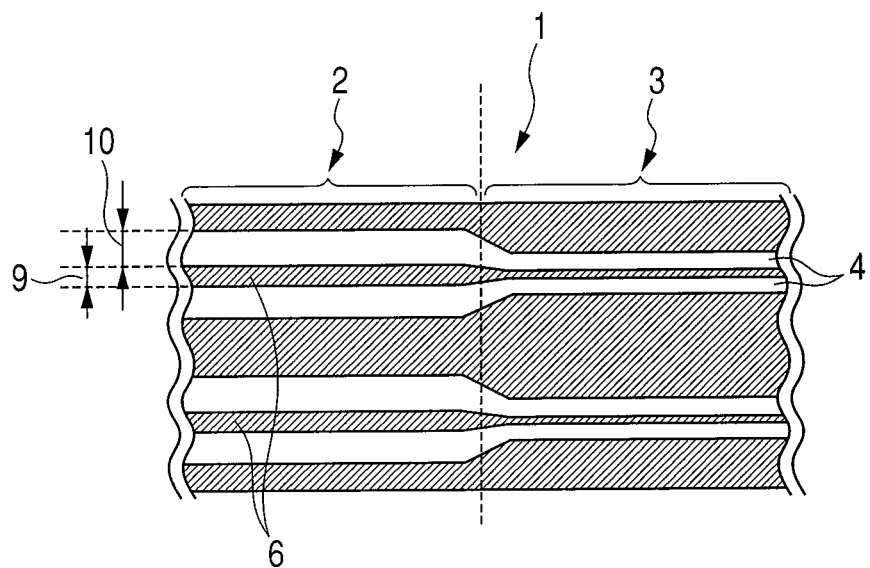
FIG. 16 is a drawing showing the wiring pattern of the differential line near the movable unit and the fixed unit of the flexible printed circuit of the present invention.

FIG. 16 shows the fixed unit 2 and the movable unit 3 of a FPC1 identical to FIG. 1, and shows the case where there are no low impedance lines such as power lines or ground 5 lines adjacent to both sides of the differential line 4. In all other respects the structure is identical to the first embodiment shown in FIG. 1. However, the gap between the differential line 4 and the adjacent lines is preferably separated 500 μm or more to prevent an imbalance in the differential line.

In the present embodiment, the differential line gap 9 in the movable unit 3 is narrowed so that fluctuations in transmission characteristics due to contact between the FPC1 and nearby metal can be suppressed the same as in the first embodiment and stable signal transmission can be achieved. These effects are obtained for the same reasons as in the first embodiment.

Fifth Embodiment

The fifth embodiment of this invention is described next while referring to FIG. 17.

Figure 17:
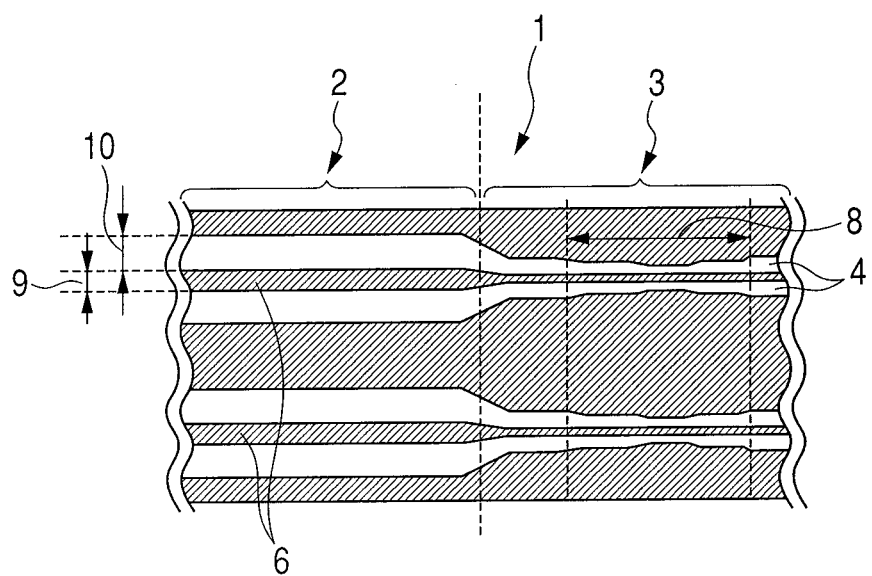
FIG. 17 is a drawing of the wiring pattern of the differential line near the movable unit and the fixed unit of the flexible printed circuit of the present invention, showing an example of the state in the movable unit when the line width in the section contacting the nearby metal is becoming narrower.

FIG. 17 shows the fixed unit 2 and the movable unit 3 of a FPC1 identical to FIG. 2, and shows the case where there are no low impedance lines such as power lines or ground 5 lines adjacent to both sides of the differential line 4. In all other respects the structure is identical to the second embodiment shown in FIG. 2. However, the gap between the differential line 4 and the adjacent lines must be separated 500 μm or more to prevent an imbalance in the differential lines.

In the present embodiment, the differential line gap 9 in the movable unit 3 is narrowed so that fluctuations in transmission characteristics due to contact between the FPC1 and nearby metal can be suppressed the same as in the second embodiment and stable signal transmission can be achieved. These effects are obtained for the same reasons as in the second embodiment.

Sixth Embodiment

The sixth embodiment of this invention is described next while referring to FIG. 18.

Figure 18:
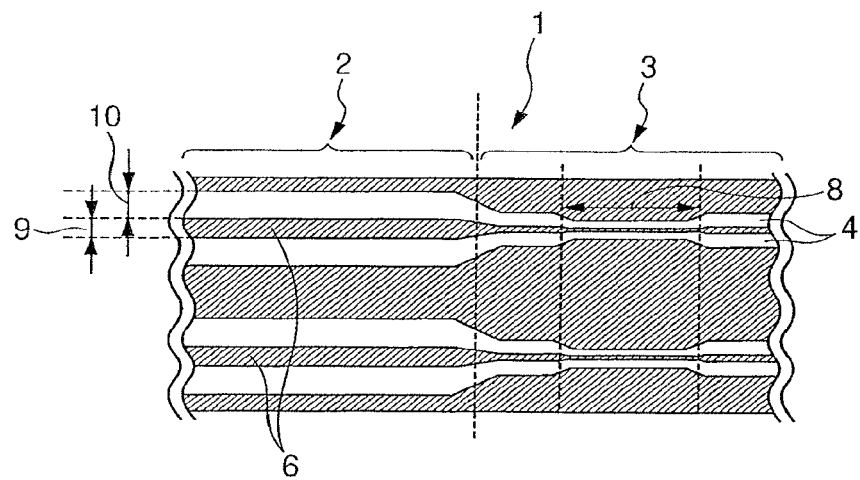
FIG. 18 is a drawing of the wiring pattern of the differential line near the movable unit and the fixed unit of the flexible printed circuit of the present invention, showing an example of the state in the movable unit when the line gap in the section contacting the nearby metal is becoming narrower.
Figure 19:
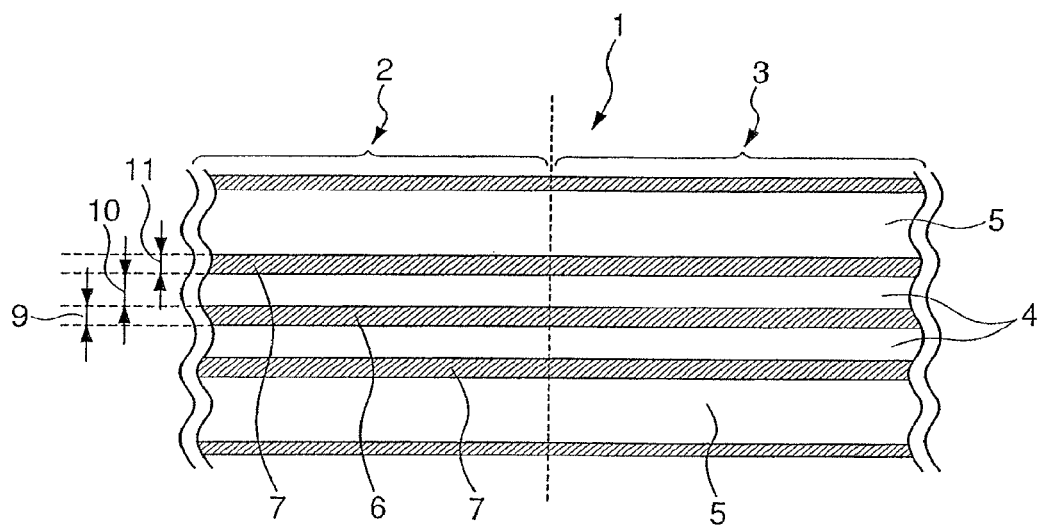
FIG. 19 is a drawing of the wiring pattern of the differential line structure of the related art near the movable unit and the fixed unit of the flexible printed circuit showing a structure in which the line gap and the line width are fixed in the fixed unit and the movable unit and the differential line and adjacent ground line are wired.

FIG. 18 shows the fixed unit 2 and the movable unit 3 of a FPC1 identical to FIG. 3, and shows the case where there are no low impedance lines such as power lines or ground 5 lines adjacent to both sides of the differential line 4. In all other respects the structure is identical to the third embodiment shown in FIG. 3. However, the gap between the differential line 4 and the adjacent lines must be separated 500 μm or more to prevent an imbalance in the differential lines.

In the present embodiment, the differential line gap 9 in the movable unit 3 is narrowed so that fluctuations in transmission characteristics due to contact between the FPC1 and nearby metal can be suppressed the same as in the third embodiment and stable signal transmission can be achieved. These effects are obtained for the same reasons as in the third embodiment.

The present invention described in the above embodiments is an electronic device including a mechanism to change the relative positions of two circuit boards, a FPC electrically connecting to those two circuit boards that includes a fixed unit and a movable unit; and capable of providing an optical disc drive and electronic device utilizing the above described flexible printed circuit (FPC) that can achieve stable transmission characteristics even if the positions of the circuit boards change.

What is claimed is:
1. An electronic device comprising:
a first case;
a second case;
a mechanism to change relative positions of the first case and the second case; and
a flexible printed circuit with a variable shape, and connected to the first case and the second case,
wherein the flexible printed circuit includes:
a fixed unit clamped to the first case or the second case; and a movable unit with a shape that changes along with the change in the relative positions of the first case and the second case, wherein the fixed unit and the movable unit include common differential lines that extend through a boundary between the fixed unit and the movable unit, wherein a gap between the differential lines in the movable unit is narrower than a gap between the differential lines in the fixed unit, and wherein the movable unit is configured to contact a nearby metal of the electronic device in at least one shape of the movable unit.

2. The electronic device according to claim 1, wherein the differential lines in the fixed unit have a differential characteristic impedance within ±10 percent of a reference impedance, and the differential lines in the movable unit have a differential characteristic impedance within −10 to +30 percent of the reference impedance in a state where the movable unit is not in contact with the first and the second cases; and wherein the reference impedance is a differential characteristic impedance established for at least specifications or standards of a differential signal to send, or is a differential input impedance or a differential output impedance of input or output circuits on a differential signal transmission circuit.

3. The electronic device according to claim 1, wherein the differential lines in the fixed unit have a differential characteristic impedance within a range from 90 to 110 ohms, and the differential lines in the movable unit have a differential characteristic impedance within a range from 90 to 130 ohms in a state where the movable unit is not in contact with the first case and the second case.

4. The electronic device according to claim 1, wherein the gap between the differential lines in the fixed unit is within a range from 100 to 500 μm, and the gap between the differential lines in the movable unit is within a range from 50 to 130 μm.

5. The electronic device according to claim 1, wherein a position at which the gap between the differential lines begins to change is within ±10 percent of a length of the entire flexible printed circuit from the boundary between the fixed unit and the movable unit.

6. The electronic device according to claim 1, wherein a line width of one of the differential lines in the movable unit is narrower in an optional section of the movable unit than other sections of the movable unit, and wherein the line width of one of the differential lines in the movable unit includes at least two or more types.

7. The electronic device according to claim 6, wherein the optional section of the movable unit is located where the movable unit contacts at least the first case or the second case accompanying the change in the relative positions of the first case and the second case.

8. The electronic device according to claim 1, wherein the gap between the differential lines in the movable unit is narrower on the optional section of the movable unit than other sections of the movable unit, and wherein the gap between the differential lines in the movable unit includes at least two or more types.

9. The electronic device according to claim 8, wherein the optional section of the movable unit is located where the movable unit contacts at least the first case or the second case accompanying the change in the relative positions of the first case and the second case.

10. The electronic device according to claim 1, wherein the differential lines are adjacent to low impedance lines including at least a ground line or a power line.

11. The electronic device according to claim 10, wherein gaps between the differential lines in the fixed unit and the low impedance lines are within a range from 100 to 500 μm, and gaps between the differential lines in the movable unit and the low impedance lines are within a range from 50 to 130 μm.

12. The electronic device according to claim 11, wherein the gaps between the differential lines and the low impedance lines are equivalent to the gaps between the differential lines.

13. An electronic device comprising:

a first case including a first printed circuit board;

a second case including a second circuit board;

a mechanism to change relative positions of the first case and the second case; and a flexible printed circuit with a variable shape, and electrically connected to the first circuit board and the second circuit board, wherein the flexible printed circuit includes:

a fixed unit clamped to the first case or the second case; and a movable unit with a shape that changes along with the change in the relative positions of the first case and the second case, wherein the fixed unit and the movable unit include common differential lines that extend through a boundary between the fixed unit and the movable unit, wherein a gap between the differential lines in the movable unit is narrower than a gap between the differential lines in the fixed unit, and wherein the movable unit is configured to contact a nearby metal of the electronic device in at least one shape of the movable unit.

14. The electronic device according to claim 13, wherein the differential lines in the fixed unit have a differential characteristic impedance within ±10 percent of a reference impedance, and the differential lines in the movable unit have a differential characteristic impedance within −10 to +30 percent of the reference impedance in a state where the movable unit does not contact the first case and the second case; and wherein the reference impedance is a differential characteristic impedance established for at least specifications or standards of a differential signal to be sent, or is a differential input impedance or a differential output impedance of input or the output circuits on a differential signal transmission circuit.

15. An optical disc drive to at least read data or write data on an optical disc using laser light, comprising:

a first case including a first printed circuit board;

a second case including a second circuit board;

a disc tray for setting the optical disc;

a mechanism to change relative positions of the first case and the second case; and a flexible printed circuit with a variable shape, and electrically connected to the first circuit board and the second circuit board, wherein the first printed circuit board includes a SATA (Serial Advanced Technology Attachment) connector as an external interface standard, wherein the second circuit board includes a digital signal processor to process SATA signals as the external interface signal supporting SATA compliance standards;

wherein the flexible printed circuit includes a fixed unit clamped to the first case or the second case, and a movable unit with a shape that varies due to a change in the relative positions of the first case and the second case, wherein the fixed unit and the movable unit include common differential lines for sending SATA signals, wherein the common differential lines extend through a boundary between the fixed unit and the movable unit, wherein a gap between the differential lines in the movable unit is narrower than gap between the differential lines in the fixed unit, and wherein the movable unit is configured to contact a nearby metal of the optical disc drive in at least one shape of the movable unit.

16. The optical disc drive according to claim 15, wherein the differential lines in the fixed unit have a differential characteristic impedance within a range from 90 to 110 ohms, and the differential lines in the movable unit have a differential characteristic impedance within a range from 90 to 130 ohms in a state where the movable unit is not in contact with the first case and the second case.

17. The optical disc drive according to claim 15, wherein the gap between the differential lines in the fixed unit is within a range from 100 to 500 μm, and the gap between the differential lines in the movable unit is a value within a range from 50 to 130 μm.

18. The optical disc drive according to claim 15, wherein a position at which the gap between the differential lines begins to change is within ±10 percent of a length of the entire flexible printed circuit from the boundary between the fixed unit and the movable unit.

19. The optical disc drive according to claim 15, wherein a line width of one of the differential lines in the movable unit is narrower in an optional section of the movable unit than in other sections of the movable unit, and wherein the line width of one of the differential lines in the movable unit includes at least two or more types.

20. The optical disc drive according to claim 19, wherein the optional section of the movable unit is located where the movable unit contacts at least the first case or the second case accompanying the change in the relative positions of the first case and the second case.

* * * * *